United States Patent
Srinivasan et al.

(10) Patent No.: US 10,784,988 B2
(45) Date of Patent: Sep. 22, 2020

(54) CONDITIONAL FORWARD ERROR CORRECTION FOR NETWORK DATA

(71) Applicant: Microsoft Technology Licensing, LLC, Redmond, WA (US)

(72) Inventors: Sriram Srinivasan, Sammamish, WA (US); Soren Skak Jensen, Vancouver (CA); Koen Bernard Vos, Singapore (SG)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/231,167

(22) Filed: Dec. 21, 2018

(65) Prior Publication Data

US 2020/0204296 A1 Jun. 25, 2020

(51) Int. Cl.
*H04L 1/00* (2006.01)
*H03M 13/37* (2006.01)

(52) U.S. Cl.
CPC ...... *H04L 1/0043* (2013.01); *H03M 13/3715* (2013.01); *H04L 1/0029* (2013.01); *H04L 1/0046* (2013.01); *H04L 1/0052* (2013.01); *H04L 1/0075* (2013.01)

(58) Field of Classification Search
None
See application file for complete search history.

(56) References Cited

U.S. PATENT DOCUMENTS

| 5,353,059 A | 10/1994 | Lawlor et al. |
| 5,673,363 A | 9/1997 | Jeon et al. |
| 5,907,822 A | 5/1999 | Prieto, Jr. |
| 6,124,898 A * | 9/2000 | Patel .................... H04L 1/0065 348/607 |

(Continued)

FOREIGN PATENT DOCUMENTS

| KR | 101452635 | 10/2014 |
| WO | WO 03026136 | 3/2003 |
| WO | WO 2008066265 | 6/2008 |

OTHER PUBLICATIONS

Lam et al., "Selective FEC for Error-Resilient Image Coding and Transmission Using Similarity Check Functions," In *Proceedings of the International Conference on Image Processing*, pp. 3217-3220, Oct. 24, 2004.

(Continued)

*Primary Examiner* — Mujtaba M Chaudry
(74) *Attorney, Agent, or Firm* — Klarquist Sparkman, LLP

(57) ABSTRACT

Techniques are described for performing conditional forward error correction (FEC) of network data. The techniques and solutions can be applied to suppress the transmission of redundant forward error correction information for data (e.g., frames of audio and/or video data) that can be effectively recovered at the receiving device (e.g., at the decoder). For example, a first computing device that is encoding and transmitting data (e.g., encoded audio data) to a second computing device can determine whether portions (Continued)

of data can be predicted (e.g., to a certain quality measure) at the second computing device. If the portions of data can be predicted, then the first computing device can skip sending redundant copies of the portions of data (e.g., can skip sending forward error correction information) in current network packets.

20 Claims, 8 Drawing Sheets

(56) References Cited

U.S. PATENT DOCUMENTS

| | | |
|---|---|---|
| 6,597,961 B1 | 7/2003 | Cooke |
| 6,601,206 B1 | 7/2003 | Marvasti |
| 6,952,668 B1 | 10/2005 | Kapilow |
| 6,973,425 B1 | 12/2005 | Kapilow |
| 6,985,856 B2 | 1/2006 | Wang et al. |
| 7,003,448 B1 | 2/2006 | Lauber et al. |
| 7,031,926 B2 | 4/2006 | Maekinen et al. |
| 7,047,187 B2 | 5/2006 | Cheng et al. |
| 7,069,208 B2 | 6/2006 | Wang |
| 7,590,525 B2 | 9/2009 | Chen |
| 7,668,712 B2 | 2/2010 | Wang et al. |
| 7,693,710 B2 | 4/2010 | Jelinek et al. |
| 7,805,297 B2 | 9/2010 | Chen |
| 7,890,322 B2 | 2/2011 | Dai et al. |
| 7,912,712 B2 | 3/2011 | Shlomot et al. |
| 8,374,856 B2 | 2/2013 | Kim et al. |
| 2003/0115043 A1 | 6/2003 | Wiese et al. |
| 2003/0177011 A1 | 9/2003 | Yasuda et al. |
| 2004/0039464 A1 | 2/2004 | Virolainen et al. |
| 2005/0044471 A1 | 2/2005 | Chia et al. |
| 2005/0049853 A1 | 3/2005 | Lee et al. |
| 2005/0154584 A1 | 7/2005 | Jelinek et al. |
| 2005/0228651 A1* | 10/2005 | Wang .................. G10L 19/08 704/207 |
| 2005/0281334 A1* | 12/2005 | Walker ................ H04N 19/105 375/240.16 |
| 2006/0051068 A1 | 3/2006 | Gomila |
| 2006/0062304 A1 | 3/2006 | Hsia |
| 2006/0093048 A9 | 5/2006 | Taleb |
| 2006/0262864 A1 | 11/2006 | Shi et al. |
| 2006/0265216 A1 | 11/2006 | Chen et al. |
| 2006/0271373 A1 | 11/2006 | Khalil et al. |
| 2007/0027683 A1 | 2/2007 | Sung |
| 2008/0033584 A1 | 2/2008 | Zopf et al. |
| 2008/0046235 A1 | 2/2008 | Chen |
| 2008/0249767 A1 | 10/2008 | Ertan |
| 2009/0037168 A1 | 2/2009 | Gao |
| 2009/0248404 A1 | 10/2009 | Ehara et al. |
| 2009/0319264 A1 | 12/2009 | Yoshida et al. |
| 2014/0088974 A1 | 3/2014 | Mittal |
| 2017/0169833 A1 | 6/2017 | Lecomte et al. |
| 2018/0034583 A1* | 2/2018 | Low ..................... H04L 47/25 |
| 2020/0202872 A1 | 6/2020 | Jensen et al. |

OTHER PUBLICATIONS

Ali et al., "Bandwidth Efficient Adaptive Forward Error Correction Mechanism with Feedback Channel," In *Journal of Communications and Networks*, vol. 16, Issue 3, pp. 322-334, Jun. 2014.

Mei "Combined Forward Error Correction and Error Concealment for Digital Video Transmission," In *Doctoral Dissertation of Concordia University*, 148 pages, Jun. 2001.

Kondo, et al., "A Speech Packet Loss Concealment Method Using Linear Prediction", In Journal of IEICE Transactions on Information and Systems vol. 89, Issue 2, Feb. 2, 2006, pp. 806-813.

"International Search Report and Written Opinion Issued in PCT Application No. PCT/US2019/066113", dated Mar. 23, 2020, 13 Pages. (MS# 405548-WO-PCT).

"International Search Report and Written Opinion Issued in PCT Application No. PCT/US19/066112", dated Apr. 3, 2020, 11 Pages.

Xie, et al., "A New Packet Loss Concealment Algorithm in VoIP", In Proceedings of IEEE Advanced Information Management, Communicates, Electronic and Automation Control Conference, Oct. 3, 2016, pp. 1597-1601.

Notice of Allowance Issued in U.S. Appl. No. 16/231,191, dated Jun. 16, 2020, 12 Pages.

* cited by examiner

CONDITIONAL FORWARD ERROR CORRECTION FOR NETWORK DATA

BACKGROUND

Real-time communication services are used to communicate audio, video, and other types of streaming data via a computer network, such as the internet. Real-time communication services rely on the reliable and timely delivery of network packets in order to provide a positive user experience. For example, if a real-time audio communication service that is used for an audio call is experiencing network issues (e.g., lost or late network packets), then the quality of the communication can suffer.

In order to compensate for network packet loss or data corruption, forward error correction techniques can be used. Forward error correction involves sending redundant data to compensate for lost or corrupted packets. Using forward error correction, certain types of errors can be corrected at the receiver without having to re-transmit the data. While forward error correction can increase the reliability of network communications, it also requires additional bandwidth. For example, in some forward error correction techniques, the amount of bandwidth required to send the forward error correction information is as much, or more, than the bandwidth required to send the original data.

Therefore, there exists ample opportunity for improvement in technologies related to performing forward error correction for network communications.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Technologies are described for performing conditional forward error correction (FEC) of network data. The techniques and solutions can be applied to suppress the transmission of redundant forward error correction information for data (e.g., frames of audio and/or video data) that can be effectively recovered at the receiving device (e.g., at the decoder). For example, a first computing device that is encoding and transmitting data (e.g., encoded audio data) to a second computing device can determine whether portions of data can be predicted (e.g., to a certain quality measure) at the second computing device. If the portions of data can be predicted, then the first computing device can skip sending redundant copies of the portions of data (e.g., can skip sending forward error correction information)

For example, a computing device can perform operations for conditional forward error correction of data over a computer network. The operations can comprise obtaining a current portion of data to be sent in a current network packet to a second computing device via the computer network. The operations can further comprise obtaining a previous portion of data, where the previous portion of data has been previously sent to the second computing device in a previous network packet. The operations can further comprise determining whether the previous portion of data can be predicted, at the second computing device, from the current portion of data. The operations can further comprise, when the previous portion of data can be predicted form the current portion of data, skipping sending a redundant copy of the previous portion of data along with the current portion of data in the current network packet to the second computing device. The current portion of data and the previous portion of data can be portions of audio data (e.g., a current frame of audio data and a previous frame of audio data), such as streaming audio data.

As described herein, a variety of other features and advantages can be incorporated into the technologies as desired.

DETAILED DESCRIPTION

Overview

Figure 1:
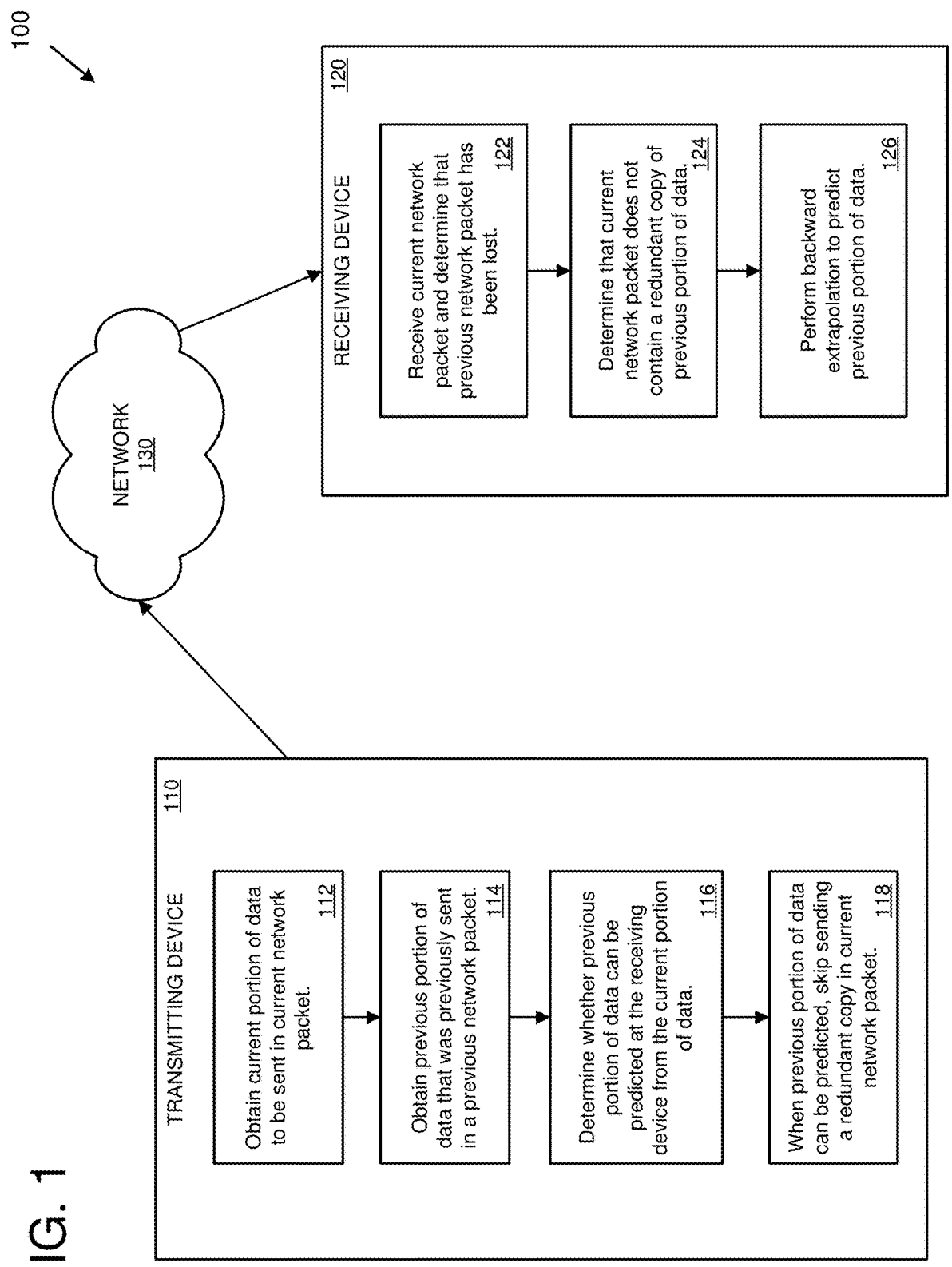
FIG. 1 is a diagram depicting an example environment for performing conditional forward error correction of data over a computer network.

As described herein, various techniques and solutions can be applied for performing conditional forward error correction (FEC) of network data. The techniques and solutions can be applied to suppress the transmission of forward error correction information (e.g., redundant forward error correction information) for data (e.g., frames of audio and/or video data) that can be effectively recovered at the receiving device (e.g., by the decoder). For example, a first computing device that is encoding and transmitting data (e.g., encoded audio data) to a second computing device can determine whether portions of data can be predicted (e.g., to a certain quality measure) at the second computing device. If the portions of data can be predicted, then the first computing device can skip sending redundant copies of the portions of data (e.g., can skip sending forward error correction information).

In some FEC solutions, redundant copies of data (also called FEC data or FEC information) are transmitted to compensate for packet loss in internet protocol (IP) computer networks. This solution is commonly called copy FEC. Using this solution, network packets contain redundant copies of data that was previously sent in prior network packets, which can be used to compensate for packet loss. For example, a current network packet could contain a current frame of data as well as a frame of data (as a redundant copy) that was previously transmitted in a prior network packet. In other words, packet N can contain the current frame N as well as the previous frame N−1, which allows frame N−1 to be recovered at the receiving device even if the packet N−1 (the previous packet that contained the frame N−1) is lost, so long as packet N is received. This solution provides the ability to compensate for missing data from a lost packet by using the redundant copy of the data from the next packet. However, this solution can also be inefficient because it uses additional bandwidth to send the redundant data. For example, if each network packet contains a current frame of data as well as a redundant copy of a prior frame of data, then the network bandwidth needed to transmit the data would be approximately twice that which would be needed if redundant copies were not sent. The bandwidth required can be even greater with solutions that send multiple previous portions of data (e.g., for a solution in which a current packet also contains redundant copies of previous portions of data from the previous three network packets).

Using the technologies described herein, data (e.g., streaming audio and/or video data) can be transmitted more efficiently, while still providing for the ability to compensate for errors (e.g., lost packets). For example, instead of always send a redundant copy of the prior network packet's data with each current network packet (e.g., as would be performed using a standard forward error correction approach), sending of redundant copies can be selectively performed based on a variety of criteria. For example, the sending device (e.g., at the encoder or other component) can determine if the prior portion of data can be predicted from the current portion of data at the receiving device (e.g., with a desired level of quality). If the prior portion of data can be predicted, then the sending device can send the current network packet without including the redundant copy (i.e., sending of the redundant copy can be skipped). The decision of whether or not to send the redundant copy can be made on a packet-by-packet basis and/or on a portion of data-by-portion of data basis. In this way, each current network packet can be examined, and a determination made regarding whether or not to include redundant copies of previously sent data. In certain situations, such as data with some amount of predictability, significant bandwidth savings can be realized. For example, with data such as audio (e.g., speech audio), the data is often predicable. For example, speech sounds can contain predictable patterns, which can allow previous portions of speech content to be predicted from current portions of speech content.

In some implementations, the redundant copy is an exact copy of the original. In some implementations, the redundant copy is a lower quality version of the original. For example, the redundant copy can be a lower bitrate version of the original. In some implementations, the lower quality version is the encoded delta (e.g., the prediction residual) between the predicted version and the original version.

In some implementations, different types of redundant copies are transmitted based on different quality levels. In an example scenario, three quality levels are used. At the highest quality level, when the prediction of the previous portion of data from the current portion of data can be performed with quality above a first quality threshold, then sending of the redundant copy is skipped. Otherwise, at a middle quality level, when the prediction can be performed with quality above a second quality threshold (but below the first quality threshold), a lower quality copy of the previous portion of data is encoded and sent with the current portion of data in the current network packet. Otherwise, at a lowest quality level, when the prediction cannot be performed with quality above the second quality threshold, a redundant copy (e.g., an exact redundant copy) of the previous portion of data is sent along with the current portion of data in the current network packet. In different implementations, more than three quality levels can be used.

In some implementations, a function is used to determine whether a previous portion of data can be predicted using a current portion of data. For example, if the data is audio (e.g., speech) data, then the function can apply a concealment algorithm to a current portion of data to reproduce a previous portion of data. The reproduced previous portion of data can then be compared to the actual previous portion of data to determine how close they are (i.e., how close the prediction is). If the prediction is close enough, then sending a redundant copy can be skipped. In some implementations, the function is a mean squared error (MSE) function that uses pitch lag values from current and previous portions of the speech data. In some implementations, the function is a signal-to-noise (SNR) measure for the magnitude or spectral envelope.

In some implementations, a machine learning model is trained and used to calculate a score representing how closely the previous portion of data can be predicted from the current portion of data. The machine learning model can be trained to make the decision using parameters representing (e.g., extracted from) the data. In some implementations, the machine learning model is used (e.g., during encoding) by providing the model with parameters from the previous portion of data and parameters from the current portion of data. The machine learning model then produces a quality score. If the quality score is above a threshold value, then sending of the redundant portion of data is skipped. Otherwise, the redundant portion of data is sent.

The technologies described herein also provide benefits in terms of reliability and efficiency (e.g., of real-time network communications services). For example, conditionally including redundant copies of previously sent data saves bits and network bandwidth, which can also reduce latency. In addition, in the event of a packet loss (e.g., which can be a likely event) in which a redundant copy of the data in the lost packet is not available, the lost data (e.g., lost audio frames) can be efficiently generated using currently received data.

In some implementations, the data is streaming data (e.g., streaming audio and/or video data) that is encoded and transmitted from the transmitting device to the receiving device according to the real-time transport protocol (RTP). RTP is a network protocol for streaming audio and/or video data using internet protocol (IP) networks. For example, each RTP network packet can contain one or more frames of current streaming data. In addition, depending whether frames of previous streaming data can be predicted, each RTP network packet can contain one or more frames of previous streaming data.

Prediction Using Parameters

In the technologies described herein, parameters that are derived from data can be used to determine whether previous data can be predicted from current data with sufficient quality. In some implementations, the parameters are generated when the data is encoded for sending to another computing device via a computer network. The parameters can also be extracted from the data (e.g., from encoded and/or unencoded data).

In implementations where the data comprises audio data (e.g., streaming audio data), the parameters can include spectral envelope parameters (e.g., linear predictive coding (LPC) parameters or coefficients), energy level, magnitude of the spectrum, and/or other types of parameters.

In implementations where the data comprises speech audio data (e.g., streaming speech audio data), the parameters can include pitch lag information (pitch lag refers to the pitch cycle period for voiced speech), spectral envelope parameters (e.g., linear predictive coding (LPC) parameters or coefficients), energy level, magnitude of the spectrum, information indicating whether the audio is voiced or unvoiced speech, and/or other types of parameters.

For example, consider an implementation that uses pitch lag and magnitude parameters for audio frames. Pitch lag and magnitude parameters would be obtained for a current frame. Pitch lag and magnitude parameters would then be predicted for the previous frame. The predicted pitch lag and magnitude parameters would then be compared to the actual pitch lag and magnitude parameters for the previous frame. For example, the difference between the predicted pitch lag and magnitude parameters and the actual pitch lag and magnitude parameters could be 0.8 (on a 0 to 1 scale). If the threshold is 0.7, then a determination can be made that the prior frame can be predicted from the current frame, and sending of a redundant copy of the prior frame can be skipped.

Other implementations can use different combinations of parameters in addition to, or instead of, those described herein. In addition, other implementations can use different threshold values for determining whether a previous portion of data can be predicted. In some implementations, the threshold varies based on the type of network connection. For example, on a relatively low bandwidth connection (e.g., a mobile connection), the threshold can be set lower so that fewer redundant copies will be sent. On a relatively high bandwidth connection, the threshold can be set higher.

Backward Extrapolation

In the technologies described herein, backward extrapolation can be used to predict data that has been lost (e.g., due to network packet loss or corruption). Specifically, backward extrapolation is used to predict earlier data from data that has been received. The earlier data is data that was generated prior in time to the current data that has been received. For example, in the context of streaming audio, if a first frame is generated at time T, and a subsequent frame is generated at time T+1, then the first frame can be predicted using backward extrapolation from the subsequent frame. For example, in the context of streaming speech audio, backward extrapolation can be performed by extending pitch cycles backward from a received frame while keeping the rest of the spectral parameters the same.

Backward extrapolation is different from forward extrapolation because with forward extrapolation data is extrapolated from current data to subsequent data (i.e., forward in time). Backward extrapolation is also different from interpolation because with interpolation missing data is reconstructed using both previous data and subsequent data.

Backward extrapolation can provide advantages over forward extrapolation in certain FEC situations. For example, backward extrapolation can reduce latency because it requires less delay at the encoder side (e.g., by the transmitting computing device). Specifically, if forward extrapolation is used, then the encoder would have to decide whether packet N is able to predict the following packet N+1. This means that the encoder cannot send packet N until packet N+1 is processed (causing delay and increasing latency). With backward extrapolation, each current network packet can be sent out as soon as it is processed because evaluation of a current network packet does not rely on any future network packets, which reduces delay and latency.

Environments for Performing Conditional Forward Error Correction

FIG. 1 is a diagram depicting an example environment 100 for performing conditional forward error correction of data over a computer network 130. The example environment 100 depicts a transmitting device 110. The transmitting device 110 can be any type of computing device (e.g., server computer, virtual machine, desktop computer, laptop computer, tablet, phone, or another type of computing device) that encodes and transmits data (e.g., streaming audio and/or video data).

As depicted at 112, a current portion of data is obtained to be sent in a current network packet to the receiving device 120. The current portion of data can be a portion of audio data, video data, text data, and/or another type of data. For example, the current portion of data can be a current audio frame (e.g., a frame of audio samples, such as a frame containing 20 milliseconds (ms) of audio samples).

At 114, a previous portion of data is obtained (e.g., generated and/or encoded prior in time to the current portion of data). The previous portion of data was sent to the receiving device 120 in a previous network packet. The previous portion of data is a portion of the same type of data (e.g., part of the same streaming data) as the current portion of data. For example, the previous portion of data can be a previous audio frame that precedes a current audio frame.

At 116, it is determined whether the previous portion of data can be predicted at the receiving device 120 from the current portion of data. For example, the determination can be made based on how accurately the pervious portion of data can be predicted based on the current portion of data. In some implementations, a predicted previous portion of data is generated based on the current portion of data (e.g., by predicting parameters for the previous portion of data), which is then compared to the actual previous portion of data to determine how close they are (e.g., to calculate a quality score). If the prediction is close enough to the actual previous portion of data (e.g., by comparing the quality score to a threshold value), then a determination can be made that the previous portion of data can be predicted. Otherwise, a determination can be made that the previous portion of data cannot be predicted (e.g., with a desired level of quality).

At 118, when the previous portion of data can be predicted (e.g., with a quality score above a threshold value), sending of a redundant copy of the previous portion of data in the current network packet is skipped. In some implementations, the previous portion of data is forward error correction information, which is not sent (e.g., suppressed) in the current network packet. Otherwise, when the previous portion of data cannot be predicted (e.g., with a quality score above a threshold value), then the redundant copy of the previous portion of data is sent in the current network packet along with the current portion of data.

The current network packet is sent to the receiving device 120 via the computer network 130 (e.g., the internet and/or other types of private or public computer networks). Depending on the determination made at 118, the current network packet may or may not contain a redundant copy of the previous portion of data (e.g., as forward error correction information).

In some implementations, the operations depicted at 112-118 are performed by one or more software components (e.g., encoders, network components, etc.) running on the transmitting device 110. For example, the components can be part of a real-time communications application, such as a voice over internet protocol (VoIP) application, in which the transmitting device 110 receives frames of data (e.g., audio data) for real-time encoding and transmission to the receiving device 120, where the data is decoded and output.

As depicted at 122, the receiving device 120 receives the current network packet and determines that the previous network packet has been lost. For example, the previous network packet can be determined to be lost if it has not been received by the receiving device 120 for a period of time.

At 124, a determination is made that the current network packet does not contain a redundant copy of the previous portion of data. For example, the determination can be made by examining the content of the current network packet. The determination can also be made based on information signaled in the network packet (e.g., header information) and/or information signaled in the content of the network packet (e.g., a signal in the encoded bitstream that indicates that the current portion of data can be used to predict the previous portion of data).

At 126, backward extrapolation is performed to predict the previous portion of data from the current portion of data. In some implementations, the data is audio data, and the prediction comprises predicting parameters (e.g., speech parameters) from the current portion of data.

In some implementations, the operations depicted at 122-126 are performed by one or more software components (e.g., decoders, network components, etc.) running on the receiving device 120. For example, the components can be part of a real-time communications application, such as a voice over internet protocol (VoIP) application, in which the receiving device 120 receives frames of data (e.g., audio data) for real-time decoding and playback by the receiving device 120.

In some implementations, the example environment 100 is an online real-time communication environment in which audio and/or video information is captured at the transmitting device 110 and transmitted to the receiving device 120 for presentation (e.g., as part of a real-time audio and/or video call, conference, meeting, etc.). For example, the online communication environment can comprise a voice over internet protocol (VoIP) service. As part of the communication, the receiving device 120 could also transmit audio and/or video back to the transmitting device 110 for presentation (e.g., as part of a two-way audio and/or video call). In addition, a number of other computing device can participate in the communication (e.g., in a conference environment).

Figure 2:
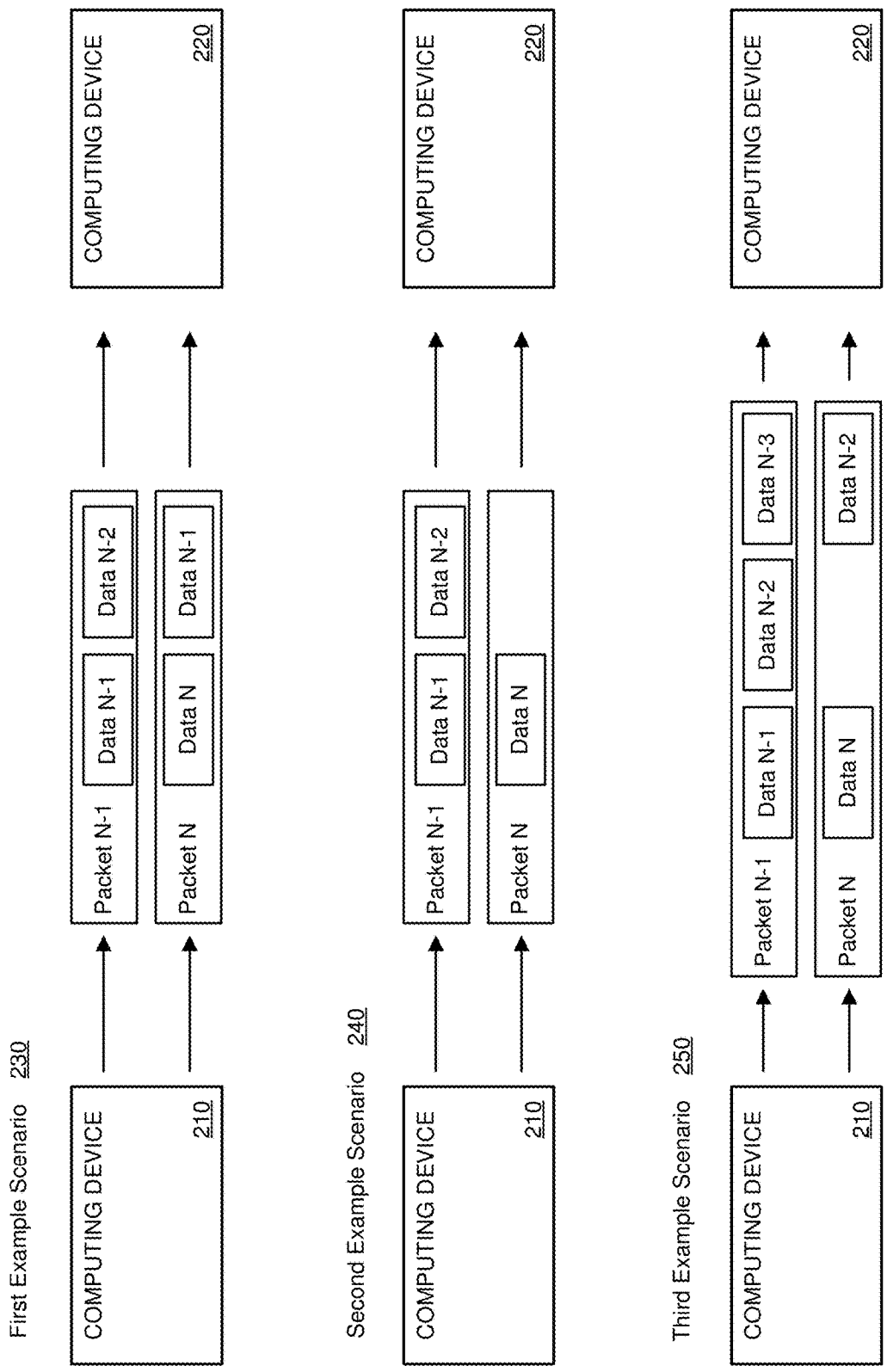
FIG. 2 is a diagram depicting example scenarios where forward error correction information is conditionally sent in network packets.

FIG. 2 is a diagram depicting example scenarios 200 where forward error correction information is conditionally sent in network packets. The example scenarios 200 involve a first computing device 210 and a second computing device 220, which can be any type of computing devices (e.g., server computers, virtual machines, desktop computers, laptop computers, tablets, phones, or other types of computing devices). The first computing device 210 is sending data (e.g., audio and/or video data) in network packets over a computer network to the second computing device 220. For example, the data could be streaming audio and/or video data (e.g., part of a real-time audio and/or video communication, such as a VoIP communication session). While the example scenarios 200 depict communication in only one direction, in general the communication can be two-way (e.g., a two-way real-time audio and/or video communication between the first computing device 210 and the second computing device 220).

For example, the first computing device 210 can encode and transmit streaming data (e.g., streaming audio and/or video). For streaming audio, the first computing device 210 can include an audio capture component (e.g., a microphone) of that captures audio and saves it in a buffer on a periodic basis. For example, 20 ms of audio samples can be obtained from the audio capture component and saved in the buffer every 20 ms. In some implementations, the first computing device 210 can comprise a video capture device and corresponding video buffer. The second computing device 220 can also have an audio capture component and/or video capture component.

In the first example scenario 230, two network packets are depicted. Network packet N is a current network packet that is being sent from the first computing device 210 to the second computing device 220. Network packet N contains current data N (e.g., a current frame of audio data) as well as previous data N−1 (e.g., a previous frame of audio data). Data N−1 is included in packet N as a redundant copy of data (e.g., as forward error correction information) that was sent in a previous network packet. Specifically, data N−1 was previously sent in packet N−1. Similar to packet N, packet N−1 contains current data N−1 as well as previous data N−2 (which was previously sent in packet N−2, which is not depicted).

The first example scenario 230 illustrates two possible situations. First, the first example scenario 230 could illustrate the normal operation of copy FEC in which a given network packet always includes the current data as well as a redundant copy of the previous data. Second, the first example scenario 230 could illustrate how the technology described herein operates when the previous portion of data (e.g., data N−1 in packet N) cannot be predicted (e.g., with a desired quality) from the current portion of data (e.g., data N in packet N).

In the second example scenario 240, two network packets are again depicted. Network packet N is a current network packet this is being sent from the first computing device 210 to the second computing device 220. Network packet N contains current data N (e.g., a current frame of audio data). However, in contrast to the first example scenario 230, network packet N in the second example scenario 240 does not contain a redundant copy of previous data N−1. The redundant copy of previous data N−1 is not included in packet N because a determination was made at the first computing device 210 that previous data N−1 can be predicted from current data N at the second computing device 220. In other words, the first computing device 210 determined that previous data N−1 could be predicted (e.g., with sufficient quality) from current data N and therefore skipped sending a redundant copy of data N−1 in packet N. Therefore, if network packet N−1 is lost (e.g., not received by the second computing device 220 within a period of time), then the second computing device 220 can reconstruct data N−1 from data N received in packet N.

Regarding network packet N−1 in the second example scenario 240, the first computing device 210 determined that current data N−1 could not be predicted from previous data N−2, and therefore included previous data N−2 as a redundant copy in network packet N−1.

The third example scenario 250 illustrates how the technology can be extended to network packets that contain multiple portions of data (e.g., multiple frames). In general, a network packet can contain one or more current portions of data and one or more previous portions of data. In the third example scenario 250, network packet N−1 contains current data N−1 as well as redundant copies of previous data N−2 and N−3. The redundant copies are included in network packet N−1 because the first computing device 210 determined that they could not be predicted at the second computing device 220 from current data N−1. In the third example scenario 250, network packet N contains current data N as well as a redundant copy of previous data N−2. The redundant copy of previous data N−2 is included in network packet N because the first computing device 210 determined that it could not be predicted at the second computing device 220 from current data N. However, a redundant copy of previous data N−1 was not included (e.g., skipped or suppressed) in network packet N because the first computing device 210 decided that it could be predicted at the second computing device 220 from current data N.

Methods for Performing Conditional Forward Error Correction

In any of the examples herein, methods can be provided for performing conditional forward error correction of data sent via a computer network. For example, redundant data (e.g., forward error correction information) can be selectively transmitted in subsequent network packets based on whether the receiver can reconstruct the redundant data from received data. If the receiver can reconstruct the redundant data, then sending of the redundant data can be skipped.

Figure 3:
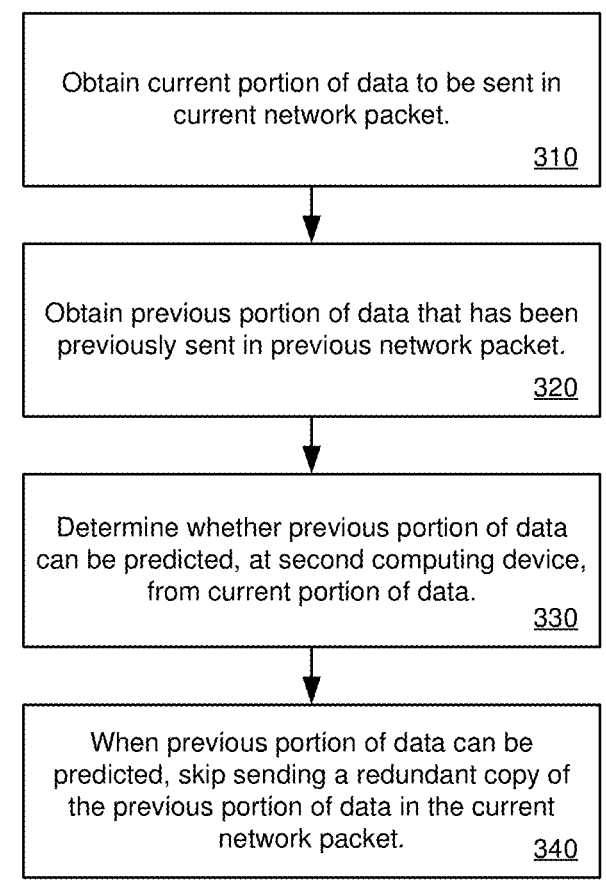
FIG. 3 is a flowchart of an example method for performing conditional forward error correction of data over a computer network.

FIG. 3 is a flowchart of an example method 300 for performing conditional forward error correction of data over a computer network. For example, the example method 300 can be performed by a computing device, such as transmitting device 110 or computing device 210.

At 310, a current portion of data is obtained to be sent in a current network packet to a second computing device over a computer network (e.g., via the internet). For example, the current network packet can be transmitted via a wired or wireless network connection. The current portion of data could be audio data, video data, text data, or another type of data. The current portion of data could also be streaming data (e.g., streaming audio data). For example, the current portion of data could be a frame of audio samples.

At 320, a previous portion of data is obtained. The previous portion of data was sent in a previous network packet. In some implementations, the previous portion of data is data that was encoded immediately prior to the current portion of data. For example, the current portion of data could be a current frame of audio data and the previous portion of data could be a preceding frame of audio data from the same stream of audio data.

At 330, it is determined whether the previous portion of data can be predicted, at the second computing device, from the current portion of data. In some implementations, determining whether the previous portion of data can be predicted from the current portion of data comprises calculating a quality score indicating how accurately the second computing device can predict the previous portion of data from the current portion of data, and comparing the quality score to a threshold value. A quality score above the threshold value indicates that the previous portion of data can be predicted with a desired quality, while a quality score that is not above the threshold value indicates that the previous portion of data cannot be predicted with the desired quality.

At 340, when the previous portion of data can be predicted, at the second computing device, from the current portion of data, then sending of a redundant copy of the previous portion of data in the current network packet is skipped. In this case, the current portion of data can be used by the second computing device to predict the previous portion of data in the event that the previous network packet is determined to be lost. In some implementations, the second computing device performs backward extrapolation from the current portion of data in order to compensate for (e.g., reconstruct) the lost previous portion of data. Otherwise, when the previous portion of data cannot be predicted from the current portion of data, a redundant copy of the previous portion of data can be sent to the second computing device in the current network packet along with the current portion of data.

Figure 4:
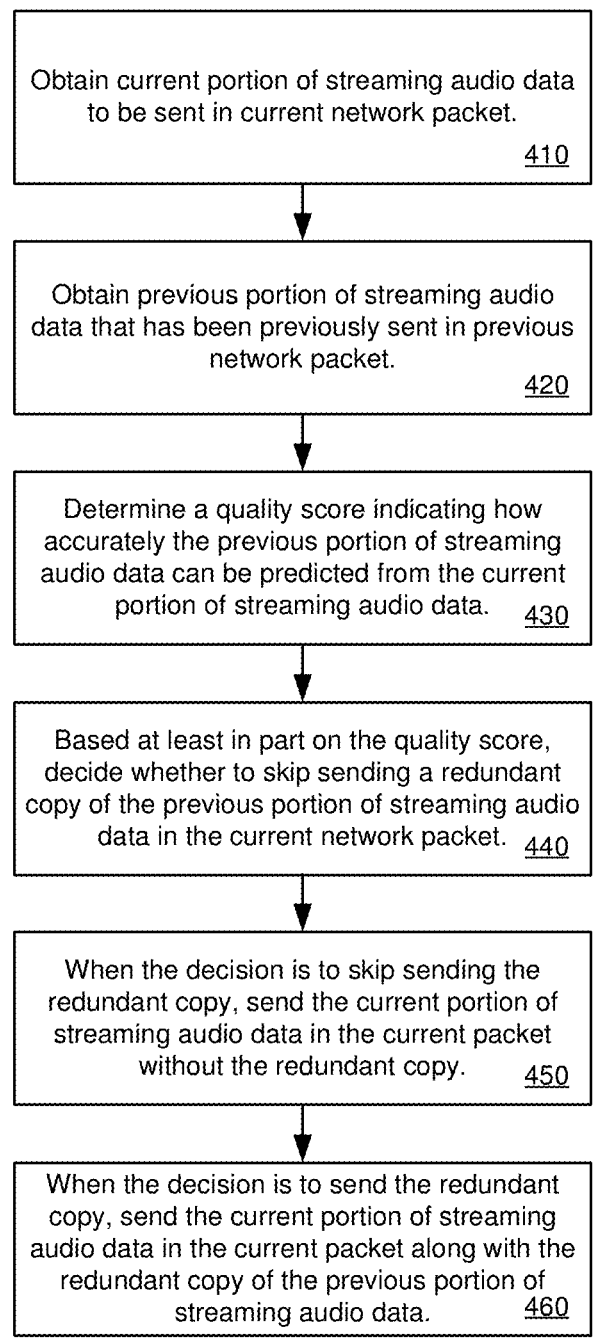
FIG. 4 is a flowchart of an example method for performing conditional forward error correction of audio data over a computer network.

FIG. 4 is a flowchart of an example method 400 for performing conditional forward error correction of audio data over a computer network. For example, the example method 400 can be performed by a computing device, such as transmitting device 110 or computing device 210.

At 410, a current portion of streaming audio data (e.g., a current frame) is obtained to be sent in a current network packet to a second computing device over a computer network (e.g., via the internet). For example, the current network packet can be transmitted via a wired or wireless network connection. The current portion of streaming audio data could be a current frame of audio data (e.g., a 20 ms frame of audio samples), a sub-frame of audio data, etc.

At 420, a previous portion of streaming audio data is obtained (e.g., a previous frame). The previous portion of streaming audio data was sent in a previous network packet. In some implementations, the previous portion of streaming audio data is audio data that was encoded immediately prior to the current portion of streaming audio data.

At 430, a quality score is determined indicating how accurately the previous portion of streaming audio data can be predicted, at the second computing device, from the current portion of streaming audio data. In some implementations, determining whether the previous portion of streaming audio data can be predicted from the current portion of streaming audio data comprises calculating the quality score based on one or more parameters (e.g., speech parameters and/or other types of parameters) indicating how accurately the second computing device can predict the previous portion of data from the current portion of data, and comparing the quality score to a threshold value. For example, a quality score above the threshold value indicates that the previous portion of streaming audio data can be predicted with a desired quality, while a quality score that is not above the threshold value indicates that the previous portion of streaming audio data cannot be predicted with the desired quality.

At 440, it is decided whether to skip sending a redundant copy of the previous portion of streaming audio data in the current network packet based at least in part on the quality score. In some implementations, the quality score is compared to a threshold value to determine whether to skip, or not skip, sending the redundant copy in the current network packet.

At 450, when the decision at 440 is to skip sending the redundant copy, the current portion of streaming data is sent in the current network packet without the redundant copy of the previous portion of streaming audio data. In this case, the current portion of streaming audio data can be used by the second computing device to predict the previous portion of streaming audio data in the event that the previous network packet is determined to be lost. In some implementations, the second computing device performs backward extrapolation from the current portion of streaming audio data in order to compensate for (e.g., reconstruct) the lost previous portion of streaming audio data.

At 460, when the decision at 440 is to send the redundant copy (i.e., to not skip sending the redundant copy), the current portion of streaming audio data is sent in the current network packet along with the redundant copy of the previous portion of streaming audio data.

Figure 5:
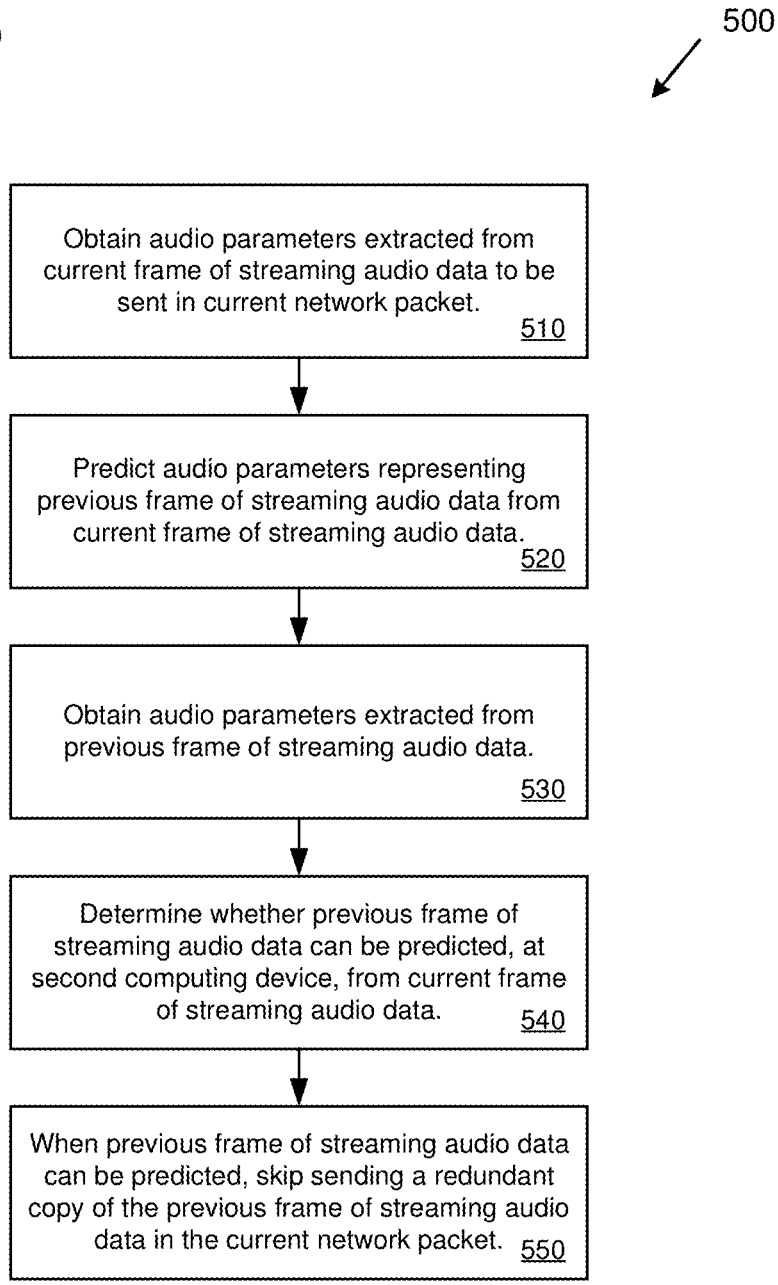
FIG. 5 is a flowchart of an example method for performing conditional forward error correction of streaming audio data over a computer network using audio parameters.

FIG. 5 is a flowchart of an example method 500 for performing conditional forward error correction of streaming audio data over a computer network using audio parameters. For example, the example method 500 can be performed by a computing device, such as transmitting device 110 or computing device 210.

At 510, a current frame of streaming audio data is obtained to be sent in a current network packet to a second computing device over a computer network (e.g., via the internet). For example, the current network packet can be transmitted via a wired or wireless network connection.

At 520, audio parameters that represent a previous frame of streaming audio data are predicted from the current frame of streaming audio data, where the previous frame of streaming audio data has been previously sent to a second computing device in a previous network packet. In some implementations, the current frame of streaming audio data and the previous frame of streaming audio data are part of a real-time communications connection (e.g., a voice call).

At 530, audio parameters that are extracted from the previous frame of streaming audio data are obtained. For example, the audio parameters can be obtained as part of an encoding process in which the previous frame of streaming audio data is encoded, according to an audio codec, for transmission to the second computing device.

At 540, it is determined whether the previous frame of streaming audio data can be predicted, at the second computing device, from the current frame of streaming audio data. The determination is based, at least in part, on a comparison of the predicted audio parameters representing the pervious frame of streaming audio data and the extracted parameters from the previous frame of streaming audio data. For example, the comparison of the parameters can be used to calculate a quality score indicating how accurately the second computing device can predict the previous frame of streaming audio data from the current frame of streaming audio data, and comparing the quality score to a threshold value. A quality score above the threshold value indicates that the previous frame of streaming audio data can be predicted with a desired quality, while a quality score that is not above the threshold value indicates that the previous frame of streaming audio data cannot be predicted with the desired quality.

At 550, when the previous frame of streaming audio data can be predicted, at the second computing device, from the current frame of streaming audio data, then sending of a redundant copy of the previous frame of streaming audio data in the current network packet is skipped. In this case, the current frame of streaming audio data can be used by the second computing device to predict the previous frame of streaming audio data in the event that the previous network packet is determined to be lost. In some implementations, the second computing device performs backward extrapolation from the current frame of streaming audio data in order to compensate for (e.g., reconstruct) the lost previous frame of streaming audio data. Otherwise, when the previous frame of streaming audio data cannot be predicted from the current frame of streaming audio data, a redundant copy of the previous frame of streaming audio data can be sent to the second computing device in the current network packet along with the current frame of streaming audio data.

The example methods 300, 400, and 500 describe performing conditional forward error correction using a current portion of data (e.g., a current audio frame) and a previous portion of data (e.g., a previous audio frame). However, the methods also cover the use of multiple current and/or previous portions of data. For example, some implementations can send multiple previous portions of data in a single network packet, which can be used to compensate for situations where multiple network packets are lost. For example, a current network packet could contain a current portion of data as well as redundant copies of two or more previous portions of data. Any of the redundant copies can be left out (skipped) if they can be predicted from the current portion of data.

Computing Systems

Figure 6:
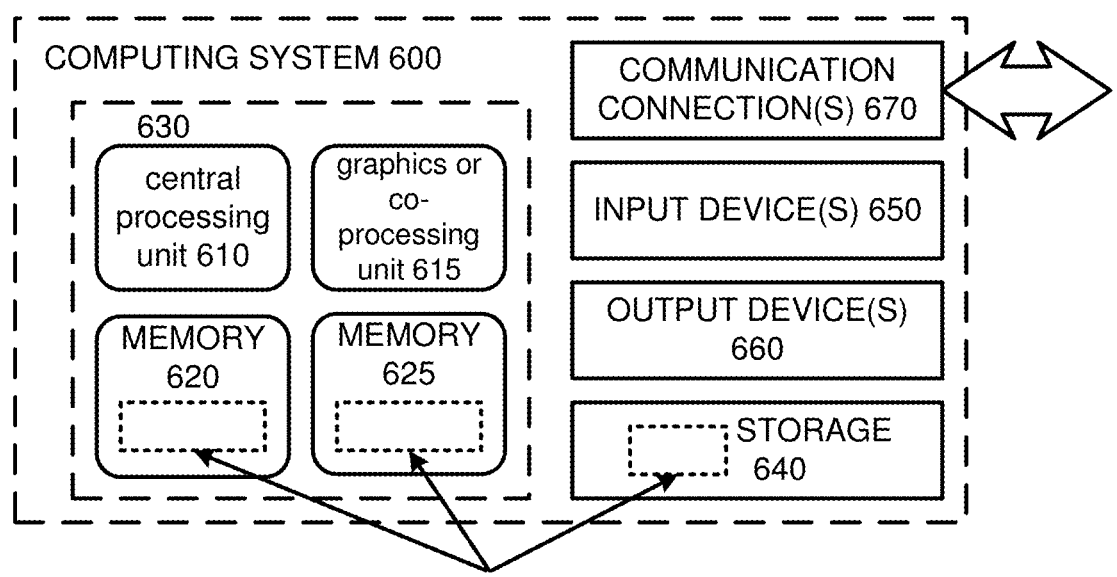
FIG. 6 is a diagram of an example computing system in which some described embodiments can be implemented.

FIG. 6 depicts a generalized example of a suitable computing system 600 in which the described technologies may be implemented. The computing system 600 is not intended to suggest any limitation as to scope of use or functionality, as the technologies may be implemented in diverse general-purpose or special-purpose computing systems.

With reference to FIG. 6, the computing system 600 includes one or more processing units 610, 615 and memory 620, 625. In FIG. 6, this basic configuration 630 is included within a dashed line. The processing units 610, 615 execute computer-executable instructions. A processing unit can be a general-purpose central processing unit (CPU), processor in an application-specific integrated circuit (ASIC), or any other type of processor. A processing unit can also comprise multiple processors. In a multi-processing system, multiple processing units execute computer-executable instructions to increase processing power. For example, FIG. 6 shows a central processing unit 610 as well as a graphics processing unit or co-processing unit 615. The tangible memory 620, 625 may be volatile memory (e.g., registers, cache, RAM), non-volatile memory (e.g., ROM, EEPROM, flash memory, etc.), or some combination of the two, accessible by the processing unit(s). The memory 620, 625 stores software 680 implementing one or more technologies described herein, in the form of computer-executable instructions suitable for execution by the processing unit(s).

A computing system may have additional features. For example, the computing system 600 includes storage 640, one or more input devices 650, one or more output devices 660, and one or more communication connections 670. An interconnection mechanism (not shown) such as a bus, controller, or network interconnects the components of the computing system 600. Typically, operating system software (not shown) provides an operating environment for other software executing in the computing system 600, and coordinates activities of the components of the computing system 600.

The tangible storage 640 may be removable or non-removable, and includes magnetic disks, magnetic tapes or cassettes, CD-ROMs, DVDs, or any other medium which can be used to store information and which can be accessed within the computing system 600. The storage 640 stores instructions for the software 680 implementing one or more technologies described herein.

The input device(s) 650 may be a touch input device such as a keyboard, mouse, pen, or trackball, a voice input device, a scanning device, or another device that provides input to the computing system 600. For video encoding, the input device(s) 650 may be a camera, video card, TV tuner card, or similar device that accepts video input in analog or digital form, or a CD-ROM or CD-RW that reads video samples into the computing system 600. The output device(s) 660 may be a display, printer, speaker, CD-writer, or another device that provides output from the computing system 600.

The communication connection(s) 670 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The technologies can be described in the general context of computer-executable instructions, such as those included in program modules, being executed in a computing system on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system.

The terms "system" and "device" are used interchangeably herein. Unless the context clearly indicates otherwise, neither term implies any limitation on a type of computing system or computing device. In general, a computing system or computing device can be local or distributed, and can include any combination of special-purpose hardware and/or general-purpose hardware with software implementing the functionality described herein.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Mobile Device

Figure 7:
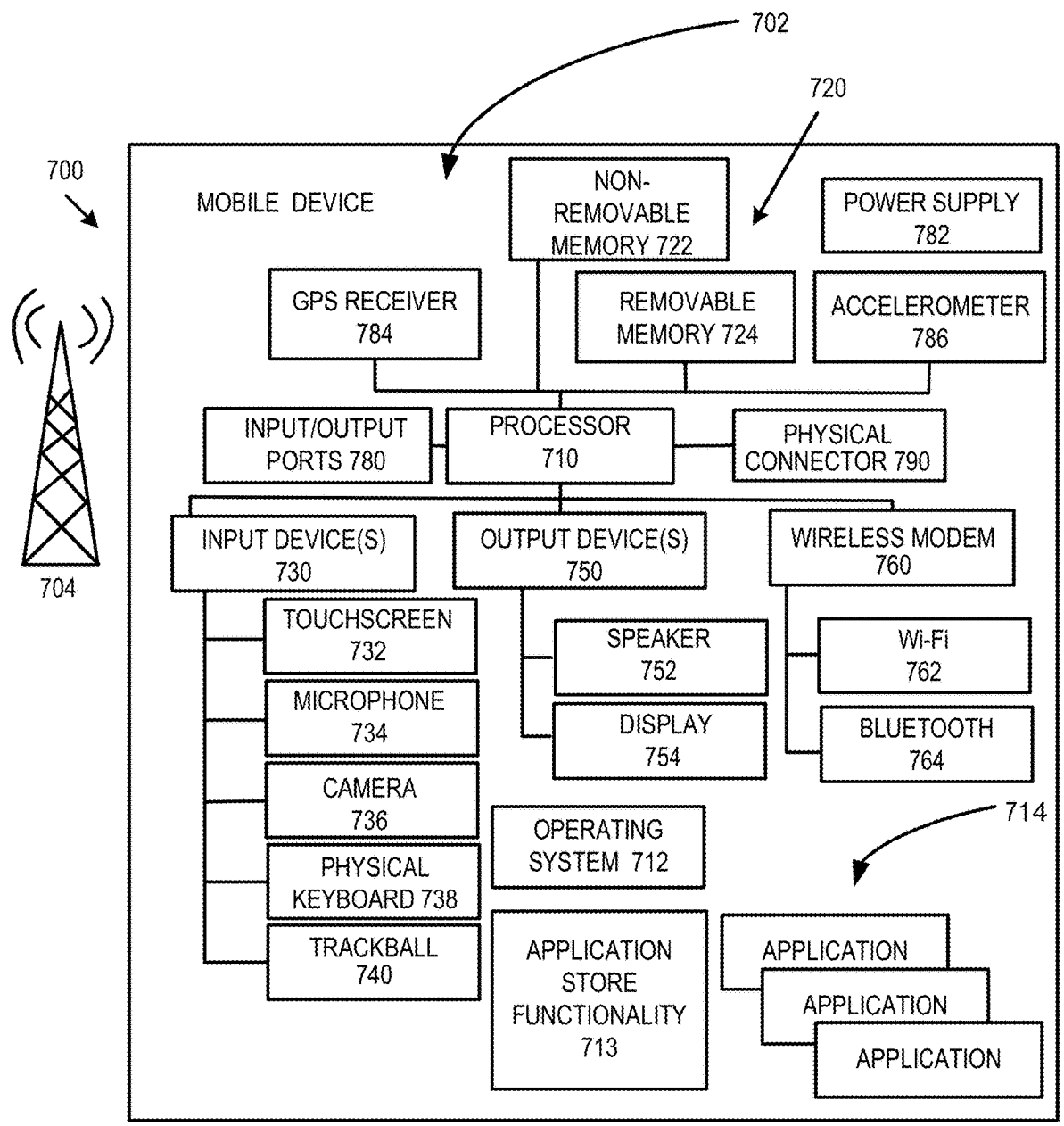
FIG. 7 is an example mobile device that can be used in conjunction with the technologies described herein.

FIG. 7 is a system diagram depicting an example mobile device 700 including a variety of optional hardware and software components, shown generally at 702. Any components 702 in the mobile device can communicate with any other component, although not all connections are shown, for ease of illustration. The mobile device can be any of a variety of computing devices (e.g., cell phone, smartphone, handheld computer, Personal Digital Assistant (PDA), etc.) and can allow wireless two-way communications with one or more mobile communications networks 704, such as a cellular, satellite, or other network.

The illustrated mobile device 700 can include a controller or processor 710 (e.g., signal processor, microprocessor, ASIC, or other control and processing logic circuitry) for performing such tasks as signal coding, data processing, input/output processing, power control, and/or other functions. An operating system 712 can control the allocation and usage of the components 702 and support for one or more application programs 714. The application programs can include common mobile computing applications (e.g., email applications, calendars, contact managers, web browsers, messaging applications), or any other computing application. Functionality 713 for accessing an application store can also be used for acquiring and updating application programs 714.

The illustrated mobile device 700 can include memory 720. Memory 720 can include non-removable memory 722 and/or removable memory 724. The non-removable memory 722 can include RAM, ROM, flash memory, a hard disk, or other well-known memory storage technologies. The removable memory 724 can include flash memory or a Subscriber Identity Module (SIM) card, which is well known in GSM communication systems, or other well-known memory storage technologies, such as "smart cards." The memory 720 can be used for storing data and/or code for running the operating system 712 and the applications 714. Example data can include web pages, text, images, sound files, video data, or other data sets to be sent to and/or received from one or more network servers or other devices via one or more wired or wireless networks. The memory 720 can be used to store a subscriber identifier, such as an International Mobile Subscriber Identity (IMSI), and an equipment identifier, such as an International Mobile Equipment Identifier (IMEI). Such identifiers can be transmitted to a network server to identify users and equipment.

The mobile device 700 can support one or more input devices 730, such as a touchscreen 732, microphone 734, camera 736, physical keyboard 738 and/or trackball 740 and one or more output devices 750, such as a speaker 752 and a display 754. Other possible output devices (not shown) can include piezoelectric or other haptic output devices. Some devices can serve more than one input/output function. For example, touchscreen 732 and display 754 can be combined in a single input/output device.

The input devices 730 can include a Natural User Interface (NUI). An NUI is any interface technology that enables a user to interact with a device in a "natural" manner, free from artificial constraints imposed by input devices such as mice, keyboards, remote controls, and the like. Examples of NUI methods include those relying on speech recognition, touch and stylus recognition, gesture recognition both on screen and adjacent to the screen, air gestures, head and eye tracking, voice and speech, vision, touch, gestures, and machine intelligence. Other examples of a NUI include motion gesture detection using accelerometers/gyroscopes, facial recognition, 3D displays, head, eye, and gaze tracking, immersive augmented reality and virtual reality systems, all of which provide a more natural interface, as well as technologies for sensing brain activity using electric field sensing electrodes (EEG and related methods). Thus, in one specific example, the operating system 712 or applications 714 can comprise speech-recognition software as part of a voice user interface that allows a user to operate the device 700 via voice commands. Further, the device 700 can comprise input devices and software that allows for user interaction via a user's spatial gestures, such as detecting and interpreting gestures to provide input to a gaming application.

A wireless modem 760 can be coupled to an antenna (not shown) and can support two-way communications between the processor 710 and external devices, as is well understood in the art. The modem 760 is shown generically and can include a cellular modem for communicating with the mobile communication network 704 and/or other radio-based modems (e.g., Bluetooth 764 or Wi-Fi 762). The wireless modem 760 is typically configured for communication with one or more cellular networks, such as a GSM network for data and voice communications within a single cellular network, between cellular networks, or between the mobile device and a public switched telephone network (PSTN).

The mobile device can further include at least one input/output port 780, a power supply 782, a satellite navigation system receiver 784, such as a Global Positioning System (GPS) receiver, an accelerometer 786, and/or a physical connector 790, which can be a USB port, IEEE 1394 (FireWire) port, and/or RS-232 port. The illustrated components 702 are not required or all-inclusive, as any components can be deleted and other components can be added.

Cloud-Supported Environment

Figure 8:
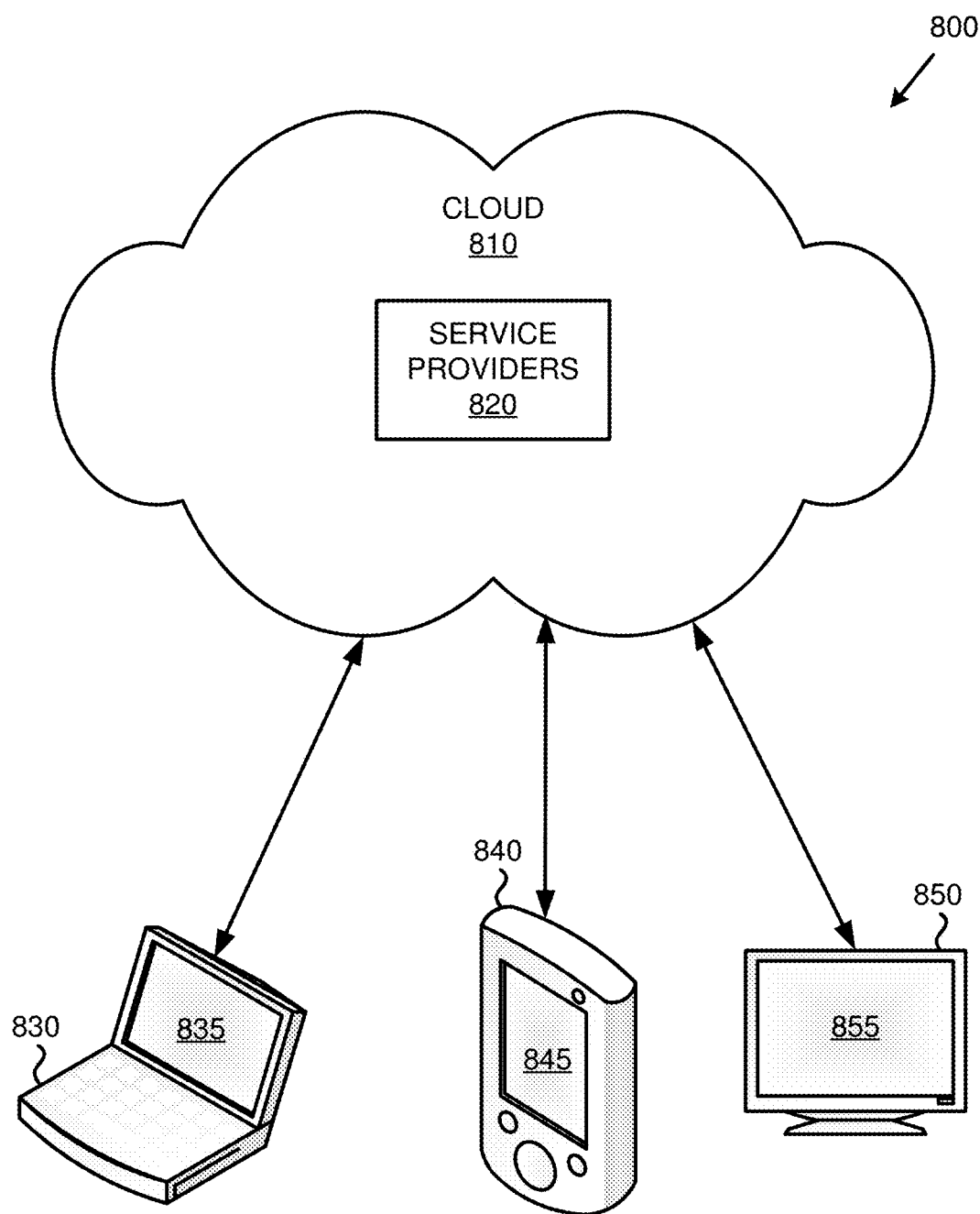
FIG. 8 is an example cloud-support environment that can be used in conjunction with the technologies described herein.

FIG. 8 illustrates a generalized example of a suitable cloud-supported environment 800 in which described embodiments, techniques, and technologies may be implemented. In the example environment 800, various types of services (e.g., computing services) are provided by a cloud 810. For example, the cloud 810 can comprise a collection of computing devices, which may be located centrally or distributed, that provide cloud-based services to various types of users and devices connected via a network such as the Internet. The implementation environment 800 can be used in different ways to accomplish computing tasks. For example, some tasks (e.g., processing user input and presenting a user interface) can be performed on local computing devices (e.g., connected devices 830, 840, 850) while other tasks (e.g., storage of data to be used in subsequent processing) can be performed in the cloud 810.

In example environment 800, the cloud 810 provides services for connected devices 830, 840, 850 with a variety of screen capabilities. Connected device 830 represents a device with a computer screen 835 (e.g., a mid-size screen). For example, connected device 830 could be a personal computer such as desktop computer, laptop, notebook, netbook, or the like. Connected device 840 represents a device with a mobile device screen 845 (e.g., a small size screen). For example, connected device 840 could be a mobile phone, smart phone, personal digital assistant, tablet computer, and the like. Connected device 850 represents a device with a large screen 855. For example, connected device 850 could be a television screen (e.g., a smart television) or another device connected to a television (e.g., a set-top box or gaming console) or the like. One or more of the connected devices 830, 840, 850 can include touchscreen capabilities. Touchscreens can accept input in different ways. For example, capacitive touchscreens detect touch input when an object (e.g., a fingertip or stylus) distorts or interrupts an electrical current running across the surface. As another example, touchscreens can use optical sensors to detect touch input when beams from the optical sensors are interrupted. Physical contact with the surface of the screen is not necessary for input to be detected by some touchscreens. Devices without screen capabilities also can be used in example environment 800. For example, the cloud 810 can provide services for one or more computers (e.g., server computers) without displays.

Services can be provided by the cloud 810 through service providers 820, or through other providers of online services (not depicted). For example, cloud services can be customized to the screen size, display capability, and/or touchscreen capability of a particular connected device (e.g., connected devices 830, 840, 850).

In example environment 800, the cloud 810 provides the technologies and solutions described herein to the various connected devices 830, 840, 850 using, at least in part, the service providers 820. For example, the service providers 820 can provide a centralized solution for various cloud-based services. The service providers 820 can manage service subscriptions for users and/or devices (e.g., for the connected devices 830, 840, 850 and/or their respective users).

Example Implementations

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions or a computer program product stored on one or more computer-readable storage media and executed on a computing device (i.e., any available computing device, including smart phones or other mobile devices that include computing hardware). Computer-readable storage media are tangible media that can be accessed within a computing environment (one or more optical media discs such as DVD or CD, volatile memory (such as DRAM or SRAM), or nonvolatile memory (such as flash memory or hard drives)). By way of example and with reference to FIG. 6, computer-readable storage media include memory 620 and 625, and storage 640. By way of example and with reference to FIG. 7, computer-readable storage media include memory and storage 720, 722, and 724. The term computer-readable storage media does not include signals and carrier waves. In addition, the term computer-readable storage media does not include communication connections, such as 670, 760, 762, and 764.

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, or any other suitable programming language. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology.

What is claimed is:

1. A computing device comprising:
a processor;
a network connection; and
memory;
the computing device configured, via computer-executable instructions, to perform operations for conditional forward error correction of data over the network connection, the operations comprising:
obtaining a current portion of data to be sent in a current network packet to a second computing device via the network connection;
obtaining a previous portion of data, wherein the previous portion of data has been previously sent to the second computing device in a previous network packet;
determining, at the computing device, whether the previous portion of data can be predicted, at the second computing device, from the current portion of data; and
when the previous portion of data can be predicted form the current portion of data, skipping sending a redundant copy of the previous portion of data along with the current portion of data in the current network packet to the second computing device.

2. The computing device of claim 1, the operations further comprising:
otherwise, when the previous portion of data cannot be predicted from the current portion of data, sending a redundant copy of the previous portion of data along with the current portion of data in the current network packet to the second computing device.

3. The computing device of claim 1 wherein the current portion of data is usable at the second computing device to perform backward extrapolation when the previous network packet is determined by the second computing device to be lost.

4. The computing device of claim 1 wherein determining whether the previous portion of data can be predicted, at the second computing device, from the current portion of data comprises:

calculating a quality score indicating how accurately the second computing device can predict the previous portion of data from the current portion of data; and
comparing the quality score to a threshold value.

5. The computing device of claim 1 wherein the data is streaming audio data, and wherein determining whether the previous portion of streaming audio data can be predicted, at the second computing device, from the current portion of streaming audio data comprises:
calculating a quality score for at least one speech parameter, wherein the quality score indicates how accurately the second computing device can predict the previous portion of streaming audio data from the current portion of streaming audio data; and
comparing the quality score to a threshold value.

6. The computing device of claim 1 wherein determining whether the previous portion of data can be predicted, at the second computing device, from the current portion of data comprises:
obtaining parameters extracted from the current portion of data;
predicting parameters representing the previous portion of data using the extracted parameters from the current portion of data;
obtaining parameters extracted from the previous portion of data;
calculating a quality score based on a difference between the predicted parameters representing the previous portion of data and the extracted parameters from the previous portion of data; and
comparing the quality score to a threshold value.

7. The computing device of claim 1 wherein the data is frames of streaming audio data that have been encoded using an audio codec, and wherein determining whether the previous frame of streaming audio data can be predicted, at the second computing device, from the current frame of streaming audio data comprises:
obtaining parameters extracted from the current frame of streaming audio data;
predicting parameters representing the previous frame of streaming audio data using the extracted parameters from the current frame of streaming audio data;
obtaining parameters extracted from the previous frame of streaming audio data;
calculating a quality score based on a difference between the predicted parameters representing the previous frame of streaming audio data and the extracted parameters from the previous frame of streaming audio data; and
comparing the quality score to a threshold value.

8. The computing device of claim 1 wherein determining whether the previous portion of data can be predicted, at the second computing device, from the current portion of data comprises:
determining whether the prediction can be performed with quality above a first quality threshold, in which case the sending of the redundant copy of the previous portion of data is skipped;
otherwise, determining whether the prediction can be performed with quality above a second quality threshold, lower than the first quality threshold, in which case the operations further comprise:
encoding a lower quality copy of the previous portion of data; and sending the lower quality copy of the previous portion of data along with the current portion of data in the current network packet to the second computing device; and otherwise, when the prediction cannot be performed above the second quality threshold, sending a redundant copy of the previous portion of data along with the current portion of data in the current network packet to the second computing device.

9. The computing device of claim 1 wherein the streaming data is streaming audio data, wherein the current and previous portions of streaming audio data are encoded according to an audio codec, and wherein the current network packet and the previous network packet are transmitted to the second computing device via a real-time network protocol for streaming media.

10. A method, implemented by a computing device, for performing conditional forward error correction of audio data, the method comprising:

obtaining a current portion of streaming audio data to be sent in a current network packet to a second computing device via a computer network;

obtaining a previous portion of streaming audio data, wherein the previous portion of streaming audio data has been previously sent to the second computing device in a previous network packet;

determining, at the computing device, a quality score indicating how accurately the previous portion of streaming audio data can be predicted, at the second computing device, from the current portion of streaming audio data;

based at least in part on the quality score, deciding whether to skip sending a redundant copy of the previous portion of streaming audio data along with the current portion of streaming audio data in the current network packet;

when the decision is to skip sending the redundant copy, sending the current portion of streaming audio data in the current network packet without the redundant copy of the previous portion of streaming audio data as forward error correction information; and when the decision is to send the redundant copy, sending the current portion of streaming audio data in the current network packet along with the redundant copy of the previous portion of streaming audio data as forward error correction information.

11. The method of claim 10 wherein, when the decision is to skip sending the redundant copy, the current portion of streaming audio data is usable at the second computing device to perform backward extrapolation when the previous network packet is determined by the second computing device to be lost.

12. The method of claim 10 wherein deciding whether to skip sending a redundant copy of the previous portion of streaming audio data along with the current portion of streaming audio data in the current network packet comprises:

comparing the quality score to a threshold value;

when the quality score is above the threshold value, skipping sending the redundant copy; and when the quality score is not above the threshold value, sending the redundant copy.

13. The method of claim 10, further comprising, based at least in part on the quality score:

determining whether the prediction can be performed with quality above a first quality threshold, in which case the sending of the redundant copy of the previous portion of streaming audio data is skipped;

otherwise, determining whether the prediction can be performed with quality above a second quality threshold, lower than the first quality threshold, in which case the method further comprises:

encoding a lower quality copy of the previous portion of streaming audio data; and sending the lower quality copy of the previous portion of streaming audio data along with the current portion of streaming audio data in the current network packet to the second computing device; and otherwise, when the prediction cannot be performed above the second quality threshold, sending the redundant copy of the previous portion of streaming audio data along with the current portion of streaming audio data in the current network packet to the second computing device.

14. The method of claim 10 wherein determining the quality score indicating how accurately the previous portion of streaming audio data can be predicted, at the second computing device, from the current portion of streaming audio data comprises:

obtaining parameters extracted from the current portion of streaming audio data;

predicting parameters representing the previous portion of streaming audio data using the extracted parameters from the current portion of streaming audio data;

obtaining parameters extracted from the previous portion of streaming audio data;

calculating the quality score based on a difference between the predicted parameters representing the previous portion of streaming audio data and the extracted parameters from the previous portion of streaming audio data.

15. The method of claim 10 wherein the current network packet and the previous network packet are transmitted to the second computing device via a real-time network protocol for streaming media.

16. A method, implemented by a computing device, for performing conditional forward error correction of audio data, the method comprising:

obtaining audio parameters extracted from a current frame of streaming audio data to be sent in a network packet to a second computing device via a computer network;

predicting audio parameters representing a previous frame of streaming audio data using the audio parameters extracted from the current frame of streaming audio data, wherein the previous frame of streaming audio data has been previously transmitted to the second computing device via the computer network;

obtaining audio parameters extracted from the previous frame of streaming audio data;

determining, at the computing device, whether the previous frame of streaming audio data can be predicted, at the second computing device, from the current frame of streaming audio data based at least in part on a comparison of the predicted audio parameters representing the pervious frame of streaming audio data and the extracted parameters from the previous frame of streaming audio data; and when the previous frame of streaming audio data can be predicted form the current frame of streaming audio data, skipping sending a redundant copy of the previous frame of streaming audio data along with the current frame of streaming audio data in the network packet.

17. The method of claim 16, further comprising:
otherwise, when the previous frame of streaming audio data cannot be predicted from the current frame of streaming audio data, sending a redundant copy of the previous frame of streaming audio data along with the current frame of streaming audio data in the network packet.

18. The method of claim 16 wherein the current frame of data is usable at the second computing device to perform backward extrapolation when the previous network packet is determined by the second computing device to be lost.

19. The method of claim 16 wherein determining whether the previous frame of streaming audio data can be predicted, at the second computing device, from the current frame of streaming audio data comprises:
calculating a quality score indicating how accurately the second computing device can predict the previous frame of streaming audio data from the current frame of streaming audio data; and
comparing the quality score to a threshold value.

20. The method of claim 16 wherein determining whether the previous frame of streaming audio data can be predicted, at the second computing device, from the current frame of streaming audio data comprises:
calculating quality scores for each of a plurality of speech parameters indicating how accurately the second computing device can predict the previous frame of streaming audio data from the current frame of streaming audio data;
calculating an overall quality score from the quality scores for the plurality of speech parameters; and
comparing the overall quality score to a threshold value.

* * * * *